(12) United States Patent
Hu

(10) Patent No.: US 6,842,372 B1
(45) Date of Patent: Jan. 11, 2005

(54) EEPROM CELL HAVING A FLOATING-GATE TRANSISTOR WITHIN A CELL WELL AND A PROCESS FOR FABRICATING THE MEMORY CELL

(75) Inventor: YongZhong Hu, San Jose, CA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 152 days.

(21) Appl. No.: 10/236,829

(22) Filed: Sep. 6, 2002

(51) Int. Cl.[7] ............................................. G11C 16/04
(52) U.S. Cl. ......................... 365/185.05; 365/185.14; 365/185.02; 257/315; 257/316
(58) Field of Search ..................... 365/185.05, 185.02, 365/185.28, 185.14; 257/315, 316

(56) References Cited

U.S. PATENT DOCUMENTS

| | | | |
|---|---|---|---|
| 6,028,789 A | | 2/2000 | Mehta et al. |
| 6,064,595 A | * | 5/2000 | Logie et al. ............ 365/185.18 |
| 6,208,559 B1 | * | 3/2001 | Tu et al. ................ 365/185.18 |
| 6,215,700 B1 | * | 4/2001 | Fong et al. ............... 365/185.1 |
| 6,282,123 B1 | * | 8/2001 | Mehta ..................... 365/185.28 |
| 2001/0022359 A1 | * | 9/2001 | Mehta ........................... 257/1 |

* cited by examiner

Primary Examiner—Michael S. Lebentritt
Assistant Examiner—Toan Le
(74) Attorney, Agent, or Firm—Brinks Hofer Gilson & Lione

(57) ABSTRACT

An EEPROM memory device includes a substrate of a first conductivity type having a cell well region of a second conductivity type therein. A floating-gate transistor of the first conductivity type resides in the cell well region and includes a first region separated from a second region by a channel region. A write transistor of the second conductivity type resides in the substrate and includes a first region separated from a second region by a channel region. The second region partially extends into the cell well region and forms a p-n junction with the second region of the floating-gate transistor. The process for fabricating the EEPROM device includes forming the cell well region in the substrate by creating a retrograde doping profile. In operation, the EEPROM device transfers electrons between the cell well region and the floating-gate electrode during both programming and erasing operations.

22 Claims, 4 Drawing Sheets

US 6,842,372 B1

EEPROM CELL HAVING A FLOATING-GATE TRANSISTOR WITHIN A CELL WELL AND A PROCESS FOR FABRICATING THE MEMORY CELL

TECHNICAL FIELD

The present invention relates, generally, to non-volatile memory devices and to methods of fabrication and, more particularly, to EEPROM cells and to methods for their fabrication.

BACKGROUND

The trend in semiconductor fabrication technology is toward the construction of smaller and smaller devices. As the feature size of individual components within a semiconductor device is reduced, the packing density of the devices can be increased. Accordingly, in addition to fabricating devices having reduced feature sizes, cell architecture plays an important role in achieving high packing densities. Electrically-erasable-read-only-memory (EEPROM) devices are particularly difficult to fabricate at high packing density because of the relatively large capacitive coupling necessary to program and erase the device. Further, EEPROM cells require high voltage and low voltage transistors for their operation. These factors lead to relatively large cell size and accompanying smaller storage capability as compared to volatile memory devices, such as dynamic-random-access-memory (DRAM) and static-random-access-memory (SRAM) devices, and the like.

EEPROM cells are extensively used in programmable logic devices (PLDs). EEPROM cells used in PLDs devices can have a two-transistor design or a three-transistor design. A three-transistor EEPROM cell, for example, includes a write transistor, a read transistor, and a floating-gate (or sense) transistor. In a two-transistor device, the functions of the read and write transistor are combined into a single transistor. Although the read and write functions can be combined into a single transistor to produce an EEPROM cell having only two transistors, a relatively large surface area must still be provided to accommodate the capacitive coupling necessary to program and erase the memory cell.

To program an EEPROM cell, a high voltage $V_{pp}+$ is applied to the gate electrode of the write transistor and a relatively low voltage $V_{pp}$ is applied to the drain (bit line contact) of the write transistor. The voltage applied to the write transistor gate electrode turns the write transistor on, allowing the voltage applied to the bit line to be transferred to the source of the write transistor. Electrons on the floating-gate electrode are drawn from the floating-gate electrode to the source of the write transistor, leaving the floating-gate electrode at a high positive potential. The application of such high voltage levels is a write condition that results in a net positive charge being stored in the EEPROM cell. In a typical EEPROM cell, the electron path from the floating-gate electrode to the source of the write transistor can involve traversal of a relatively high resistance path in view of the relative positioning of the write transistor and the floating-gate transistor.

To erase an EEPROM cell, a voltage $V_{cc}$ is applied to the gate of the write transistor, a ground potential is applied to the bit line, and a high voltage $V_{pp}+$ is applied to the control-gate electrode. Under this bias condition, the high voltage applied to the control-gate electrode is coupled to the floating-gate electrode and the EEPROM cell is erased by the transfer of electrons from the substrate to the floating-gate electrode. The transfer of electrons during the erase cycle typically takes place through a tunnel oxide layer underlying the floating-gate electrode.

The efficient transfer of electrons to and from the floating-gate electrode is essential to high performance operation of an EEPROM cell. Notably, both two-transistor and three-transistor EEPROM cells depend on rapid transfer of charge between the floating-gate electrode and underlying substrate regions. Accordingly, the operational efficiency of various types of EEPROM cells can benefit from enhancements in the charge transfer structures within the memory cell.

SUMMARY

The present invention is for an EEPROM cell having a floating-gate transistor that is positioned within a cell well region of the substrate. The cell well is specially fabricated to have conductivity opposite that of the substrate in order to accommodate a floating-gate transistor having the same conductivity as the substrate. Further, the cell well region has a doping concentration that is optimized to maximize charge transfer between the cell well region and the floating-gate electrode of the floating-gate transistor.

In one embodiment of the invention, an EEPROM device is provided that includes a substrate of a first conductivity type having a cell well region of a second conductivity type. A floating-gate transistor of the first conductivity type includes a first region, a second region, and a channel region intermediate to the first and second regions all residing in the cell well region. A write transistor of the second conductivity type includes a first region and a channel region residing in the substrate. A second region of the write transistor partially extends into the cell well region and forms a p-n junction with the second region of the floating-gate transistor.

In another embodiment of the invention, an EEPROM device includes a first memory cell and a second memory cell. The first and second memory cells include a floating-gate transistor residing in a cell well region and a write transistor residing in the substrate. A first word line electrically couples the write transistor of the first memory cell and a second word line electrically couples the write transistor of the second memory cell. A floating-gate region is capacitively coupled to the floating-gate electrode of the floating-gate transistors in the first and second memory cells. A bit line is electrically coupled to the write transistors of the first and second memory cells. A first sense line is electrically coupled to the first memory cell and a second sense line is electrically coupled to the second memory cell.

In yet another embodiment of the invention, a process is provided for fabricating an EEPROM device. The process includes providing a substrate of a first conductivity type and forming a cell well region of a second conductivity type in the substrate. A doping process is carried out to create a retrograde doping profile in the cell well region. A floating-gate transistor is formed having a first electrode region in the cell well region. A write transistor is formed having a first electrode region in the substrate and a second electrode region partially extending into the cell well region. The second electrode region of the write transistor forms a p-n junction with the first electrode region of the floating-gate transistor.

Figure 1:
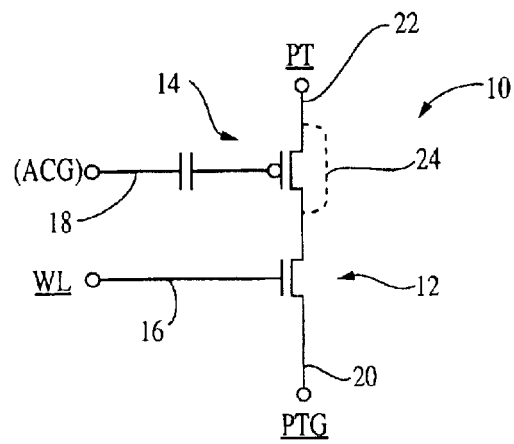
FIG. 1 illustrates a schematic diagram of a two-transistor EEPROM cell arranged in accordance with the invention.

It will be appreciated that for simplicity and clarity of illustration, elements shown in the Figures have not necessarily been drawn to scale. For example, the dimensions of some of the elements are exaggerated relative to each other for clarity. Further, where considered appropriate, reference numerals have been repeated among the Figures to indicate corresponding elements.

DETAILED DESCRIPTION

FIG. 1 illustrates a schematic circuit diagram of a two-transistor memory cell 10 arranged in accordance with one embodiment of the invention. The two-transistor memory cell includes a write transistor 12 and floating-gate transistor 14. A word line 16 is electrically coupled to the gate electrode of write transistor 12. A control-gate region 18 is capacitively coupled to the gate electrode of floating-gate transistor 14. A bit line 20 is electrically coupled to an electrode region of write transistor 12 and a sense line 22 is electrically coupled to an electrode region of floating-gate transistor 14. In accordance with the invention, the electrode regions and the channel region of floating-gate electrode 14 are formed in a cell well region 24.

Figure 2:
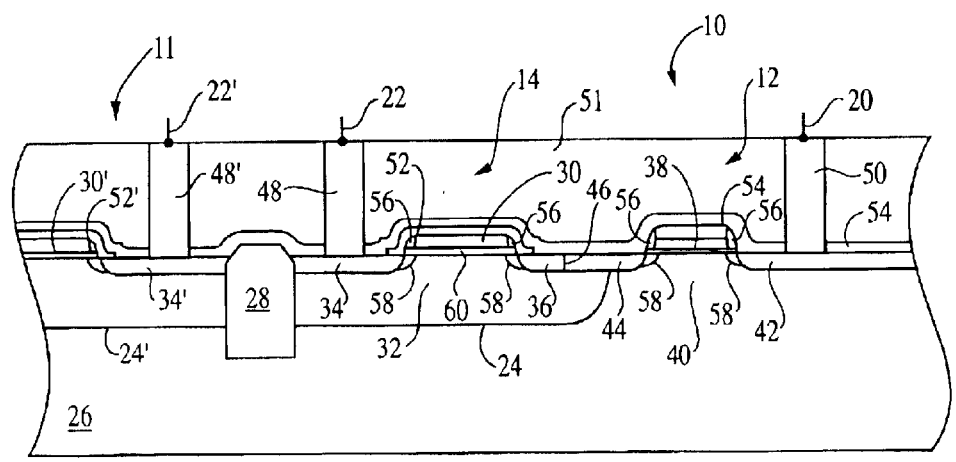
FIG. 2 illustrates, in cross-section, a two-transistor EEPROM cell arranged in accordance with the invention.

FIG. 2 illustrates, in cross-section, memory cell 10 and a portion of an adjacent memory cell 11. Cell well region 24 resides in a semiconductor substrate 26. The active regions of memory cells 10 and 11 are electrically isolated from each other by an isolation region 28. Floating-gate transistor 14 includes a gate electrode 30 overlying a channel region 32. A first electrode region 34 and a second electrode region 36 reside in cell well 24 and are separated by channel region 32. Write transistor 12 includes a gate electrode 38 overlying a channel region 40 and separated therefrom by a gate dielectric layer 41. A first electrode region 42 resides in substrate 26 and is separated from a second electrode region 44 by channel region 40. Second electrode region 44 extends into cell well 24 and forms a p-n junction 46 with second electrode region 36.

First electrode region 42 is connected to bit line 20 by a metal interconnect 48. Sense line 22 makes electrical contact to first electrode region 42 through a metal interconnect 50. Metal interconnects 48 and 50 are preferably formed by fabricating contact openings in an interlevel dielectric layer 51 that overlies semiconductor substrate 26. The openings are filled with an electrically conductive metal such as aluminum, an aluminum alloy, a refractory metal, a refractory metal silicide, and the like. As depicted in FIG. 2, interlevel dielectric layer 51 is planarized to form a planar surface upon which additional metal interconnects can be formed.

In a preferred embodiment, substrate 26 is a p-type substrate, cell well 24 is an n-type region, floating-gate transistor 14 is a p-type transistor, and write transistor 12 is an n-type transistor. Those skilled in the art will realize, however, that the conductivity of all substrate regions and transistors can be reversed without affecting the operability of the invention.

In accordance with the invention, additional structures are also fabricated to improve the performance of memory cells 10 and 11. A floating-gate protection layer 52 overlies floating-gate electrode 30 and a dielectric liner 54 overlies the active and isolation regions of semiconductor substrate 26 and the gate electrodes of the floating-gate and write transistors.

In addition to floating-gate protection layer 52 and dielectric liner 54, sidewall spacers 56 are formed adjacent to the edges of floating-gate electrode 30 and write transistor gate electrode 38. Further, source/drain extension regions 58 are formed in substrate 26 beneath the edges of gate electrodes 30 and 38. Additional performance improvement is also obtained by forming refractory metal silicide regions at locations where electrical interconnects are made to gate electrodes and electrode regions in semiconductor substrate 26. In a preferred embodiment, the refractory metal silicide regions are formed by a salicide process, in which a refractory metal silicide is selectively formed by a chemical-vapor-deposition (CVD) process. In a preferred embodiment of the invention, gate electrodes 30 and 38 are polycrystalline and silicon layers formed by CVD and isotropic etching processes. In addition to polycrystalline silicon, other materials commonly used for the fabrication of semiconductor devices, such as refractory metals, refractory metal silicides, and the like, can also be used to form gate electrodes 30 and 38.

Floating-gate electrode 30 is separated from cell well 24 by a tunnel dielectric layer 60. In operation of memory cell 10, voltages are applied to memory cell 10 that cause electrons to tunnel through tunneled dielectric layer 60. In accordance with the invention, both programming and erasing of floating-gate electrode 30 take place by the transfer of electrons to and from floating-gate electrode 30 through cell well 24.

In accordance with the invention, electron transfer from cell well 24 is optimized by creating a retrograde doping profile in cell well 24. The retrograde doping profile can be created by several different processes known to those skilled in the art. For example, where cell well 24 is formed by ion implantation, an ion implantation energy can be selected to place the peak doping concentration at a distance into substrate 26 away from the substrate surface. Where cell well 24 is an n-type region, phosphorus ions at an implant dose of about 1E14 ions/cm$^2$ to about 1E15 ions/cm$^2$ are implanted into substrate 26 at an implantation energy of about 30 keV to about 80 keV. The implant process places the peak phosphorus doping concentration in substrate 26 at a depth of about 0.2 microns to about 0.4 microns from the substrate surface. Further, multiple implant steps can be carried out to precisely adjust the doping concentration at various depths in cell well 24. Those skilled in the art will appreciate that other n-type dopants, such as arsenic and the like, can be used and that the implant parameters will be adjusted accordingly.

Figure 3:
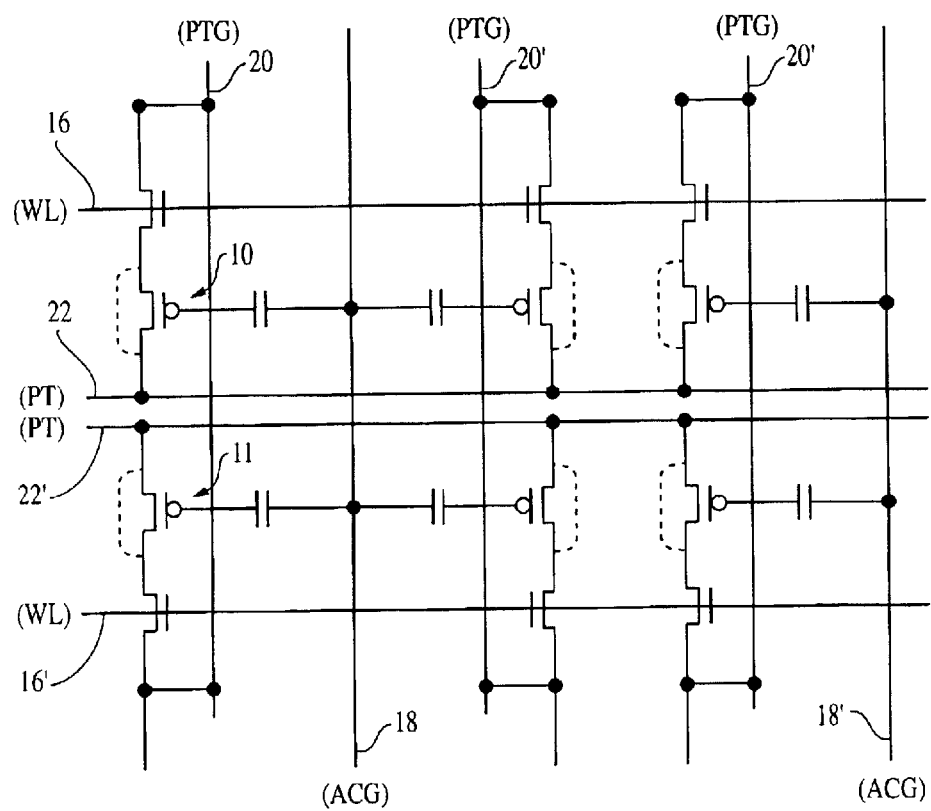
FIG. 3 illustrates a schematic diagram of an EEPROM cell array containing two-transistor memory cells in accordance with one embodiment of the invention.

One embodiment of a two-transistor memory array arranged in accordance with the invention is illustrated in FIG. 3. The portion of the memory array illustrated in FIG. 3 is serviced by word lines 16 and 16', bit lines 20 and 20', sense lines 22 and 22' and control-gate regions 18 and 18'. The elements denoted herein as 18', 20', and so forth, identify features associated with the unselected cells of the memory array.

Bit line 20 is electrically coupled to the write transistors of memory cell 10 and adjacent memory cell 11. Sense line 22 is electrically coupled memory cell 10 and sense line 22' is electrically coupled to adjacent memory cell 11. Control-gate region 18 is capacitively coupled to the floating gate transistors of both memory cell 10 and adjacent memory cell 11.

Operations are carried out on the various memory cells within the array by selecting rows and columns within the array. As shown in Table 1, programming operations take place where programming voltages are applied to the word line and the bit line of a particular cell. Correspondingly, read operations take place where a read voltage is applied to both the word line and the bit line of a particular cell. For example, referring to FIG. 3, where programming voltage is applied to word line 16 and to bit line 20, data will be stored in memory cell 10, but not in memory cell 11 or in any of the remaining cells illustrated in FIG. 3.

Voltages applied to the terminals of memory cell 10 for erase, program and read operations are illustrated below in Table 1.

To read data stored in memory cell 10, read voltage $V_{cc}$ is applied to word line 16 and a small voltage $V_{acg}$ is applied to control-gate region 16. The read voltage is also applied to bit line 20. Under these conditions, if a negative charge is stored on floating-gate electrode 30, floating-gate transistor 14 will be on and the read voltage $V_{cc}$ will be detected at sense line 22.

Figure 4:
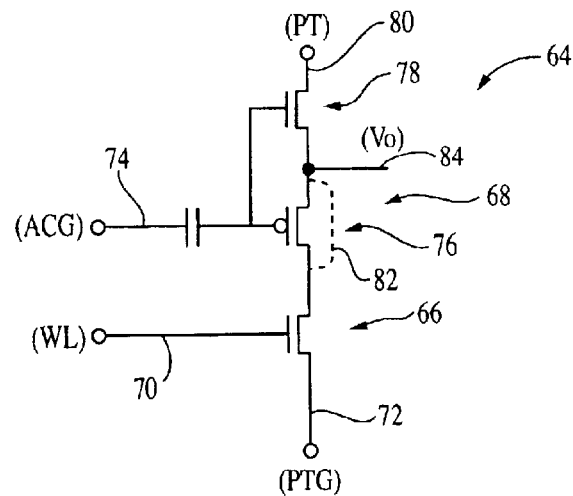
FIG. 4 illustrates a schematic circuit diagram of a three-transistor EEPROM cell arranged in accordance with the invention.

A three-transistor memory cell 64 arranged in accordance with the invention is illustrated in FIG. 4. Memory cell 64 is formed in a semiconductor substrate 85 and includes a write transistor 66 and a floating-gate transistor 68. Write transistor 66 is coupled to a word line 70 and to a bit line 72. Floating-gate transistor 68 is capacitively coupled to a control-gate region 74. In memory cell 64, floating-gate transistor 68 is a complementary-metal-oxide silicon (CMOS) transistor that includes a p-type MOS (PMOS) transistor 76 and an n-type MOS (NMOS) transistor 78. The floating-gate electrode of floating-gate transistor 68 controls both PMOS transistor 76 and NMOS transistor 78. A sense line 80 is electrically coupled to NMOS transistor 78. In the embodiment illustrated in FIG. 4, PMOS transistor 76

TABLE 1

| Mode | | Selected Row | | | | Unselected Row | | | |
| --- | --- | --- | --- | --- | --- | --- | --- | --- | --- |
| | | WL | ACG | PT | PTG | WL | ACG | PT | PTG |
| Erase | | Vcc | Vpp+ | 0 | 0 | | | | |
| Program | Selected Column | Vpp+ | 0 | HZ | Vpp | Vunsel | 0 | HZ | Vpp |
| | Unselected Column | Vpp+ | 0 | HZ | Vunsel | Vunsel | 0 | HZ | Vunsel |
| Read | Selected Column | Vcc | Vacg | 0 | Vcc | 0 | Vacg | 0 | Vcc |
| | Unselected Column | Vcc | Vacg | 0 | 0 | 0 | Vacg | 0 | 0 |

In Table 1 and in FIG. 3, word line 16 is designated "WL" and control-gate region 18 is designated "ACG." Further, sense line 22 is designated "PT" and bit line 20 is designated as "PTG." Table 1 shows operating voltages for both a selected cell (designed as selected row and selected column) and an adjacent cell (designed unselected row and unselected column). Programming voltage $V_{pp}+$ is preferably about 12 volts and bit line voltage $V_{pp}$ is preferably about 10 volts to about 11 volts. Read voltage $V_{cc}$ is preferably about 1.8 volts to about 3.6 volts. The voltage designated $V_{acg}$ is a bias voltage applied to the control-gate region that can range from about 0 volts to about $V_{cc}$. The term "HZ" designates that the terminal voltage is allowed to float during programming of the memory cell. In the unselected memory cell, $V_{unsel}$ designates a bias voltage applied to the word line and bit line to avoid unintentional programming of an unselected memory cell.

As shown in Table 1, to program memory cell 10, programming voltage is applied to word line 16 and to bit line 20. Since the programming voltage applied to word line 16 turns write transistor 12 on, the voltage applied to bit line 20 is transferred across channel region 40 to second electrode region 44 and into cell well 24. The high positive voltage impressed on cell well 24 causes electrons to flow from floating-gate electrode 30 across tunnel dielectric layer 60 to cell well 24.

To erase memory cell 10, high voltage $V_{pp}+$ is applied to control-gate region 18, which is capacitively coupled to floating-gate electrode 30. Cell well 24 is maintained at ground potential, which results in the flow of electrons from cell well 24 across tunnel dielectric layer 60 to floating-gate electrode 30.

resides in a cell well 82. An output node 84 ($V_O$) is electrically coupled to both PMOS transistor 76 and NMOS transistor 78.

Figure 5:
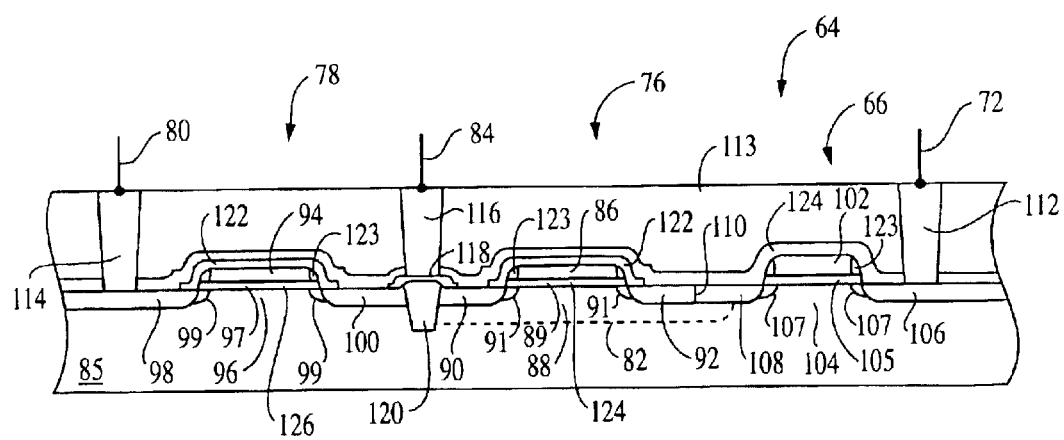
FIG. 5 illustrates, in cross-section, a three-transistor EEPROM cell arranged in accordance with one embodiment of the invention.

A cross-sectional view of memory cell 64 is illustrated in FIG. 5. PMOS transistor 76 includes a floating-gate electrode 86 overlying a channel region 88 and separated therefrom by a gate dielectric layer 89. A first electrode region 90 and a second electrode region 92 are formed in cell well 82 and separated by channel region 88 and by lightly doped source/drain regions 91. NMOS transistor 78 includes a floating-gate electrode 94 overlying a channel region 96 and separated therefrom by a gate dielectric layer 97. NMOS transistor 78 also includes a first electrode region 98 and a second electrode region 100 separated from first electrode region 98 by channel region 96 and by lightly doped source/drain regions 99.

Write transistor 66 includes a gate electrode 102 overlying a channel region 104 and separated therefrom by a gate dielectric layer 105. A first electrode region 106 is separated from a second electrode region 108 by channel region 104 and by lightly doped source/drain regions 107. Second electrode region 108 partially extends into cell well 82 and forms a p-n junction 110 with second electrode region 92 of PMOS transistor 76.

Bit line contact 72 is electrically coupled to first electrode region 106 of write transistor 66 by an interconnect 112 formed in an ILD layer 113. Correspondingly, first electrode region 98 of NMOS transistor 78 is electrically connected to sense line 80 by an interconnect 114 formed in ILD layer 113. Output node 84 is electrically connected to both first electrode region 90 and second electrode region 100 by an interconnect 116 and by a connection lead 118. Connection lead 118 electrically contacts first electrode region 90 and second electrode region 100 and overlies an isolation region 120.

In similarity with the two-transistor memory cell embodiment, memory cell 64 includes additional features to enhance the operational performance of the memory cell. For example, a floating-gate protection layer 122 overlies floating-gate electrodes 86 and 94. Further, a dielectric liner 124 overlies the surface of semiconductor substrate 85 and gate electrodes 86, 94 and 102. Also, sidewall spacers 123 are also formed as described above in connection with the two-transistor embodiment.

Figure 6:
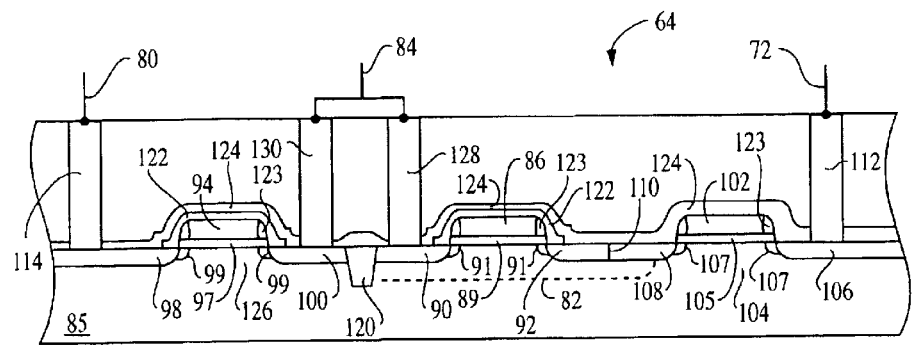
FIG. 6 illustrates, in cross-section, a three-transistor EEPROM cell arranged in accordance with another embodiment of the invention.

An alternative embodiment of a three-transistor memory cell is illustrated in the cross-sectional view of FIG. 6. In the alternative embodiment, output node before is coupled to PMOS transistor 76 and NMOS transistor 78 by separate interconnects 128 and 130. The fabrication of separate interconnects 128 and 130 to construct output node 84 involves an overall simplified fabrication procedure compared to the common interconnects structure illustrated in FIG. 5. In particular, by fabricating separate interconnect structures 128 and 130 to electrically couple the PMOS and NMOS transistors to an output node 84, it is unnecessary to fabricate a connection lead, such as connection lead 118. While offering a simplified fabrication process, the embodiment illustrated in FIG. 6 results in a slightly larger cell area than the embodiment illustrated in FIG. 5. All remaining features of the embodiment illustrated in FIG. 6 are identical to those illustrated in FIG. 5.

Figure 7:
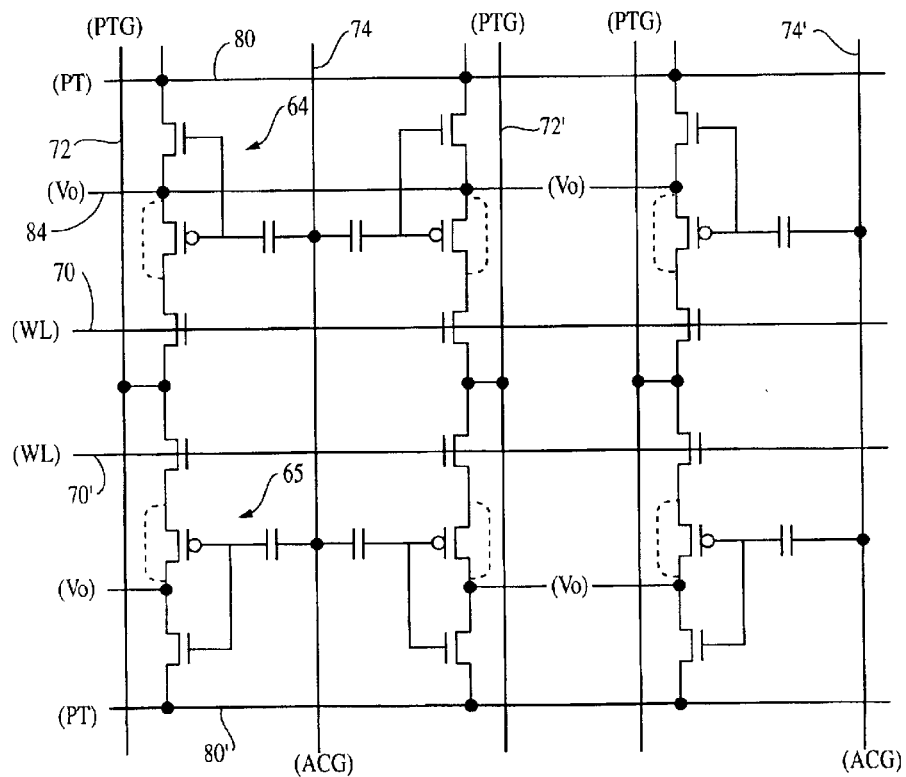
FIG. 7 illustrates a schematic diagram of an EEPROM cell array containing three-transistor memory cells arranged in accordance with the invention.

FIG. 7 illustrates a schematic diagram of a memory array containing memory cell 64 integrated with additional memory cells, such as memory cell 56. Control-gate region 74 services numerous memory cells adjacently positioned to one another in the array, such as memory cells 64 and 65.

Word line 70 is coupled to memory cell 65 and word line 70' is coupled to adjacent memory cell 65. Similarly, sense line 80 is coupled to memory cell 65 and sense line 80' is coupled to adjacent memory cell 65.

Table 2 illustrates the operational conditions for memory cell 64.

TABLE 2

| Mode | | Selected Row | | | | Unselected Row | | | | |
| --- | --- | --- | --- | --- | --- | --- | --- | --- | --- | --- |
| | | ACG | PTG | WL | Vo | PT | ACG | PTG | WL | Vo | PT |
| Erase | | Vpp+ | 0 | Vcc | HZ | 0 | | | | | |
| Prog | Selected Column | 0 | Vpp | Vpp+ | HZ | HZ | 0 | Vpp | Vunsel | HZ | HZ |
| | Unselected Column | 0 | Vunsel | Vpp+ | HZ | HZ | 0 | Vunsel | Vunsel | HZ | HZ |
| Read | Selected Column | Vacg | Vcc | Vcc | 0 | | Vacg | Vcc | 0 | 0 | |
| | Unselected Column | Vacg | 0 | Vcc | 0 | | Vacg | 0 | 0 | 0 | |

The notation set forth in Table 2 has the same meaning and voltage values as that appearing in Table 1 described above. The operational voltages are shown for both selected cells and unselected cells. In similarity with the two-transistor embodiment, voltages $V_{unsel}$ are impressed on the word lines and bit lines coupled to the unselected cells to avoid unintentional programming of these cells while carrying out operations on a selected cell.

The programming of cell 64 is carried out by applying a high voltage $V_{pp}+$ to word line 70 and applying a programming voltage $V_{pp}$ to bit line 72. Further, cell 64 is erased by applying a high voltage $V_{pp}+$ to control-gate region 74 and a low voltage $V_{cc}$ to word line 70. In similarity to the two-transistor embodiment, programming and erasing are carried out by transferring electrons to and from floating-gate electrode 86 and cell well 82. Electron transfer takes place across a tunnel dielectric layer 124 underlying floating-gate electrode 86. In contrast to the two-transistor embodiment, erasing also occurs by transfer of electrons from floating-gate electrode 94 to channel region 96 across a gate dielectric layer 126. By coupling voltage $V_{pp}+$ to floating-gate electrodes 86 and 94 through control-gate region 74, electrons are transferred onto the floating-gate electrode from two separate substrate regions. Accordingly, the cell erasing operation can be carried out efficiently and at high speed.

Thus, it is apparent that there has been described, in accordance with the invention, an EEPROM cell having a floating-gate transistor within a cell well and a process for fabricating the memory cell that fully provides the advantages set forth above. Those skilled in the art will recognize that numerous modifications and variations can be made without departing from the spirit and scope of the invention. For example, the memory cell can be integrated into numerous semiconductor devices, such as micro processor devices, micro controller devices, programmable logic devices, and the like. Accordingly, all such variations and modifications are intended to be included within the scope of the appended claims and equivalents thereof.

What is claimed is:

1. An EEPROM device comprising:
    a substrate of a first conductivity type having a cell well region of a second conductivity type;
    a floating-gate transistor of the first conductivity type having a first region, a second region and a channel region intermediate to the first and second regions residing in the cell well region; and
    a write transistor of the second conductivity type having a first region and a channel region in the substrate, and having a second region partially extending into the cell well region and forming a p-n junction with the second region of the floating-gate transistor.

2. The device of claim 1 further comprising a first electrical contact to the first region of the floating-gate transistor, wherein a sense voltage is coupled to the floating-gate transistor through the first electrical contact.

3. The device of claim 2 further comprising a second electrical contact to the first region of the write transistor, wherein a programming voltage is coupled to the cell well region from the second electrical contact through the first region, the channel region, and the second region of the write transistor.

4. The device of claim 3, wherein the floating-gate transistor comprises a floating-gate electrode overlying the channel region, and wherein electrons enter the cell well region from the floating-gate electrode in response to the programming voltage.

5. The device of claim 4 further comprising a control-gate region in the substrate capacitively coupled to the floating-gate electrode.

6. The device of claim 1, wherein the first conductivity type is p-type and the second conductivity type is n-type.

7. The device of claim 1, wherein the floating-gate transistor comprises a CMOS transistor including an NMOS transistor and a PMOS transistor, and wherein the floating-gate transistor of the first conductivity type comprises the PMOS transistor.

8. The device of claim 7 further comprising an output node electrically connected to the PMOS transistor.

9. The device of claim 8 further comprising an isolation region separating the PMOS transistor and the NMOS transistor and an output node electrically connected to the NMOS transistor, wherein the output node of the NMOS transistor and the output node of the PMOS transistor are electrically connected though an electrical lead overlying the isolation region.

10. An EEPROM device comprising:
a first memory cell including a floating-gate transistor residing in a cell well region within a substrate and a write transistor residing in the substrate;
a second memory cell including a floating-gate transistor residing in a cell well within the substrate and a write transistor residing in the substrate;
a first word line electrically coupled to the write transistors of the first memory cell and a second word line electrically coupled to the write transistor of the second memory cell;
a control-gate region capacitively coupled to the floating-gate transistors of the first and second memory cells;
a bit line electrically coupled to the write transistor of the first and second memory cells; and
a first sense line electrically coupled the first memory cell and a second sense line electrically coupled to the second memory cell.

11. The EEPROM device of claim 10, wherein the write transistor of each memory cell comprises a first electrode region, and wherein the bit line is electrically connected to the first electrode region.

12. An EEPROM device comprising:
a first memory cell including a floating-gate transistor residing in a cell well region within a substrate and a write transistor residing in the substrate;
a second memory cell including a floating-gate transistor residing in a cell well within the substrate and a write transistor residing in the substrate;
a first word line electrically coupled to the write transistors of the first memory cell and a second word line electrically coupled to the write transistor of the second memory cell;
a control-gate region capacitively coupled to the floating-gate transistors of the first and second memory cells;
a bit line electrically coupled to the write transistors of the first and second memory cells; and
a first sense line electrically coupled the first memory cell and a second sense line electrically coupled to the second memory cell,
wherein the write transistor of each memory cell comprises a first electrode region, and wherein the bit line is electrically connected to the first electrode region, and
wherein the write transistor of each memory cell further comprises a second electrode region separated from the first electrode region by a channel region, and wherein the second electrode region partially extends into the cell well region and forms a p-n junction with an electrode region of the floating-gate transistor.

13. An EEPROM device comprising:
a first memory cell including a floating-gate transistor residing in a cell well region within a substrate and a write transistor residing in the substrate;
a second memory cell including a floating-gate transistor residing in a cell well within the substrate and a write transistor residing in the substrate;
a first word line electrically coupled to the write transistors of the first memory cell and a second word line electrically coupled to the write transistor of the second memory cell;
a control-gate region capacitively coupled to the floating-gate transistors of the first and second memory cells;
a bit line electrically coupled to the write transistor of the first and second memory cells; and
a first sense line electrically coupled the first memory cell and a second sense line electrically coupled to the second memory cell,
wherein the floating-gate transistor comprises a CMOS transistor comprising an NMOS transistor and a PMOS transistor.

14. The EEPROM device of claim 13 further comprising an output voltage node electrically coupled to the NMOS transistor and to the PMOS transistor.

15. The EEPROM device of claim 14, wherein the output voltage node is electrically connected to an electrode region of the NMOS transistor and an electrode region of the PMOS transistor, and wherein the electrode regions are separated by an isolation region, and wherein the output voltage node comprises an electrical connection overlying the isolation region.

16. The EEPROM device of claim 15, wherein the write transistor of each memory cell comprises first and second electrode regions separated by a channel region, wherein the bit line is electrically connected to the first electrode region, and wherein the second electrode region partially extends into the cell well region and forms a p-n junction with an electrode region of the PMOS transistor.

17. A process for fabricating an EEPROM device comprising:
providing a substrate of a first conductivity type;
forming a cell well region of a second conductivity type in the substrate, wherein the cell well region has a retrograde doping profile;
forming a floating-gate transistor having a first electrode region in the cell well region; and
forming a write transistor having a first electrode region in the substrate and a second electrode region partially extending into the cell well region,
wherein the second electrode region form a p-n junction with the first electrode region of the floating-gate transistor.

18. The process of claim 17, wherein forming a floating-gate transistor further comprises forming second electrode region in the cell well region separated from the first electrode region by a channel region and forming a bit line contact to the second electrode region.

19. The process of claim 17, wherein forming a floating-gate transistor comprises forming a PMOS transistor in the cell well region and an NMOS transistor in the substrate, wherein the PMOS transistor comprises a second electrode region separated from the first electrode region by a channel region and wherein the NMOS transistor comprises an electrode region in the substrate separated from the first electrode region by an isolation region.

20. The process of claim 19 further comprising forming an output node electrically connected to the electrode region of the NMOS transistor and to the first electrode region of the PMOS transistor.

21. An EEPROM device comprising:
- a first memory cell including a floating-gate transistor residing in a cell well region within a substrate, the floating-gate transistor having first and second electrodes in the cell well region, and a write transistor residing in the substrate;
- a second memory cell including a floating-gate transistor residing in a cell well within the substrate, the floating-gate transistor having first and second electrodes in the cell well region, and a write transistor residing in the substrate;
- a first word line electrically coupled to the write transistors of the first memory cell and a second word line electrically coupled to the write transistor of the second;
- a control-gate region capacitively coupled to the floating-gate transistor of the first and second memory cells;
- a bit line electrically coupled to the write transistor of the first and second memory cells; and
- a first sense line electrically coupled the first memory cell and a second sense line electrically coupled to the second memory cell.

22. The EEPROM device of claim 21, wherein the first sense line is electrically coupled to the first memory cell and the second sense line is electrically coupled to the first floating gate electrode of the second memory cell.

* * * * *